United States Patent
Suzunaga et al.

(10) Patent No.: US 6,737,623 B2
(45) Date of Patent: May 18, 2004

(54) PHOTO-DETECTING SEMICONDUCTOR DEVICE AND AN APPARATUS HAVING SUCH A PHOTO-DETECTING SEMICONDUCTOR DEVICE

(75) Inventors: Hiroshi Suzunaga, Kawasaki (JP); Shigeyuki Sakura, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 10/097,951

(22) Filed: Mar. 15, 2002

(65) Prior Publication Data

US 2002/0166947 A1 Nov. 14, 2002

(30) Foreign Application Priority Data

Mar. 15, 2001 (JP) .................................. 2001-073844

(51) Int. Cl.[7] .................................................. H01J 40/14
(52) U.S. Cl. ................................... 250/206; 250/214 A
(58) Field of Search ............................... 250/206, 214 A, 250/214 R; 340/870.29, 870.28, 518, 531

(56) References Cited

U.S. PATENT DOCUMENTS

| 4,491,830 A | 1/1985 | Miyabe |
| 4,663,521 A | 5/1987 | Maile |
| 4,887,312 A | 12/1989 | Dannhaeuser |
| 4,998,294 A | 3/1991 | Banks et al. |
| 5,119,156 A * | 6/1992 | Kawahara et al. ......... 257/432 |
| 5,651,384 A | 7/1997 | Rudrich |
| 6,392,282 B1 * | 5/2002 | Sahara et al. ............. 257/438 |

FOREIGN PATENT DOCUMENTS

| EP | 0 289 379 | 11/1988 |
| EP | 0 473 345 | 3/1992 |
| JP | 8-248130 | 9/1996 |
| JP | 9-116508 | 5/1997 |
| JP | 3192295 | 5/2001 |

* cited by examiner

Primary Examiner—David Porta
Assistant Examiner—Seung C. Sohn
(74) Attorney, Agent, or Firm—Oblon, Spivak, McClelland, Maier & Neustadt, P.C.

(57) ABSTRACT

A photo-detecting semiconductor device according to an embodiment of the present invention has a first photodetector element and a second photodetector element placed adjacent to each other and isolated from each other to each generate an electric signal responsive to a received optical signal; a signal detecting circuit which amplifies the electric signal from said first photodetector element and outputs a detection-use electric signal to detect a predetermined optical signal received at said first photodetector element; a power supply circuit which starts the supply of power upon receiving said detection-use electric signal from said signal detecting circuit; and a signal output circuit supplied with power from said power supply circuit to amplify the electric signal from said second photodetector element and output an output-use electric signal. An electrical circuit has the photo-detecting semiconductor device.

14 Claims, 3 Drawing Sheets

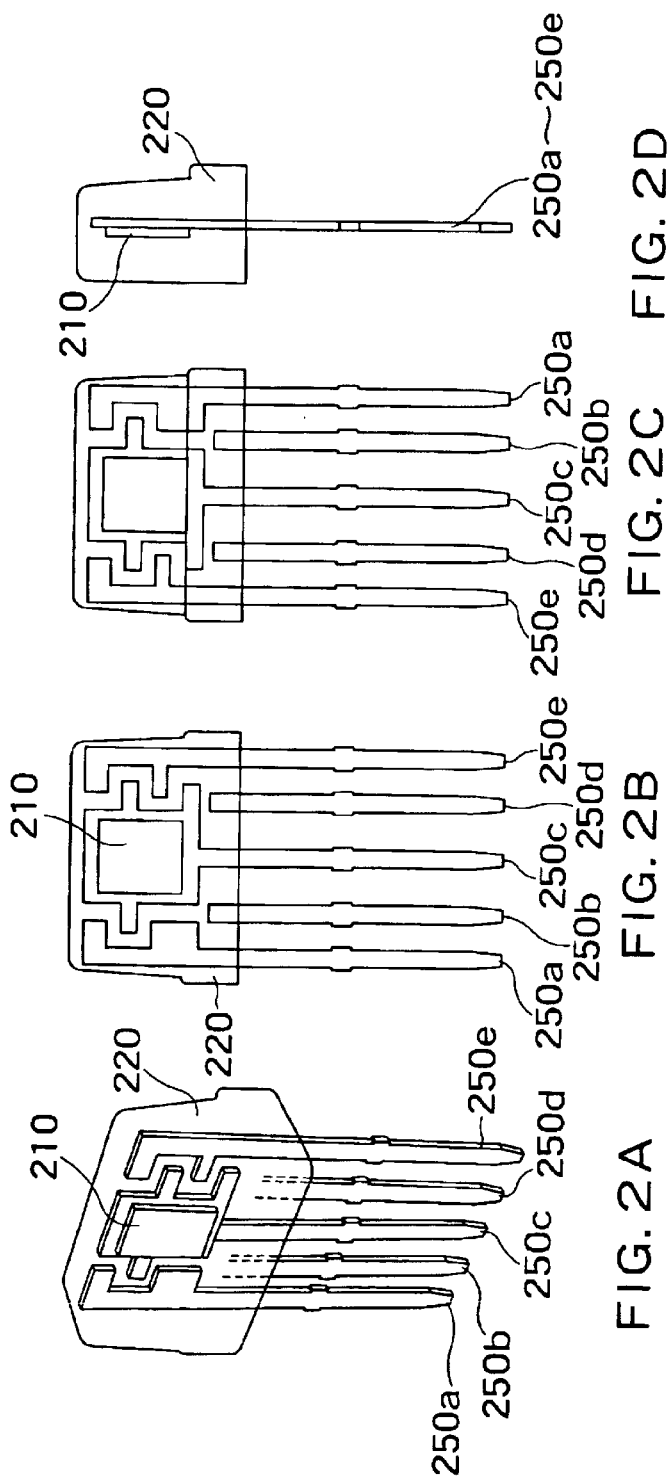

PHOTO-DETECTING SEMICONDUCTOR DEVICE AND AN APPARATUS HAVING SUCH A PHOTO-DETECTING SEMICONDUCTOR DEVICE

CROSS-REFERENCE TO RELATED APPLICATION

This application is based upon and claims the benefit of priority from the prior Japanese Patent Application No. 2001-73844, filed on Mar. 15, 2001; the entire contents of which are incorporated herein by reference.

BACKGROUND OF THE INVENTION

This invention relates to a photo-detecting semiconductor device and an electronic apparatus having such a photo-detecting semiconductor device.

Optical communication using optical signals is often utilized at internal and/or external portions of an electronic device. In optical communication, an optical signal taken out of an optical transmission device is received at a photo-detecting device via a transmission path such as optical fibers, for example. The photo-detecting device outputs an electric signal responsive to the optical signal, and the electric signal is used to control the electronic device or for other purposes.

Configuration and behaviors of a conventional photo-detecting semiconductor device are explained below with reference to FIG. 5. FIG. 5 illustrates an internal circuit 300 of a conventional photo-detecting semiconductor device. The internal circuit 300 includes a photodetector element 315 that receives an optical signal from an optical transmission path and generates an electric signal responsive to the optical signal; an amplifier circuit 365 that amplifies the electric signal generated by the photodetector element 315; a discriminator circuit 390 supplied with power from a power source to discriminate the electric signal amplified by the amplifier circuit 365; a power supply circuit 350 that supplies electric power in response to the discrimination result of the discriminator circuit 390; and a shaping/output circuit 370 supplied with power from the power supply circuit 350 to shape the waveform of the electric signal amplified by the amplifier circuit 360 and output it. The amplifier circuit 365 includes a changeover mechanism that changes the consumed current level to save the consumed current unless a signal is input. The changeover mechanism limits the electric current consumed by the amplifier circuit 365 to the level supplied from the power source and decreases the response speed of the amplifier circuit 365 in the waiting state where there is no input signal and no power is supplied from the power supply circuit 350. As a result, the current supplied by the amplifier circuit 365 is limited to approximately one half the current in its operation state. Similarly, the discriminator circuit 365, in its standby mode, is not supplied with electric power from the power supply circuit 350, and the current consumed thereby is limited to the quantity supplied from the power source. Therefore, its current consumption is reduced as compared with that in its operation mode.

Here is explained an operation upon entrance of an optical signal into the photo-detecting device or electric apparatus. In the photo-detecting device heretofore held in the standby mode, the photodetector element 315 receives the optical signal, and generates a corresponding electric signal. The amplifier circuit 365 amplifies this electric signal inputs and supplies amplified signals to the discriminator circuit 390.

The discriminator circuit 390 compares the voltage based on the electric signal from the amplifier circuit 365 with a reference voltage, and when the electric signal exceeds the predetermined voltage, it outputs to the power supply circuit 350 an electric signal for starting the supply of an electric power. In receipt of the electric signal, the power supply circuit 350 supplies power to the discriminator circuit 390 and the shaping/output circuit 370. The electric signal is amplified by the amplifier circuit 365 having supplied with power from the power supply circuit 350 and currently having its true responsive speed. Then the amplified signal is shaped in waveform by the shaping/output circuit 370, and output as an output electric signal from the photo-detecting device. The output-use electric signal output from the photo-detecting device is used for controlling an electric apparatus, for example.

Next explained is an operation upon no input of optical signal into the photo-detecting device or electric apparatus from the optical transmission path. Since the photodetector element 315 generates no electric signal, the discriminator circuit 390 generates no detection electric signal. Therefore, the power supply circuit 350 supplies power to none of the amplifier circuit 365, discriminator circuit 390 and shaping/output circuit 370. As a result, the mode enters in the standby mode where no output signal is output and the power consumption is small. In the operation mode, both the power from the power supply circuit 350 and the power direct from the power source are supplied to the amplifier circuit 365 and the discriminator circuit 390. In the standby mode, however, the power from the power supply circuit 350 is not supplied, and the power direct from the power source alone is supplied to the amplifier circuit 365 and the discriminator circuit 390. Therefore, in the standby mode, the amplifier circuit 365 and the discriminator circuit 390 receive power less than that in the operation mode directly from the power source, and carry out detection of an optical signal or no optical signal under a condition with a lower response speed.

Circuits used in electric apparatuses have recently been desired to deal with signals at progressively higher speeds. In order to process high speed signals with a high capability, in general, circuit elements have to be operated with the maximum performance. For this purpose, the amplifier circuit needs more electric current. The shaping/output circuit 370 for outputting the output-use electric signal needs a large quantity of current for driving the transmission path connecting to the output at a high speed. On the other hand, since the issue concerning energy strongly presses for decreasing power consumption, it is necessary to minimize the power consumption of the photo-detecting semiconductor device and the electric apparatus in the no-signal mode, i.e. in the standby mode.

In the conventional photo-detecting semiconductor device and the electric apparatus, the power supply circuit 350 interrupts the supply of power to the shaping/output circuit 370, amplifier circuit 365 and discriminator circuit 390 in the standby mode, and the power source directly supplies power to the amplifier circuit 365 and the discriminator circuit 390. In this manner, the conventional technique decreased the supply of power to the photo-detecting semiconductor device and the electric apparatus to minimize the power consumption in the standby mode.

However, in regard to the amplifier circuit 365, for example, since its circuit design must meet its true performance in the high-response mode, i.e. in the operation mode, the supplied power in the standby mode cannot be decreased so much. Additionally, to have the amplifier circuit 365 operate with less supplied power in the standby mode than in the operation mode, it is necessary to have a single amplifier cope with two different modes, namely, the standby mode and the operation mode. This requirement inevitably complicates the amplifier circuit 365. Moreover, complication of the circuit encumbered full performance of the true capability of the circuit element.

SUMMARY OF THE INVENTION

According to an embodiment of the present invention, there is provided a photo-detecting semiconductor device comprising: a first photodetector element and a second photodetector element placed adjacent to each other and isolated from each other to each generate an electric signal responsive to a received optical signal;

- a signal detecting circuit which amplifies the electric signal from said first photodetector element and outputs a detection-use electric signal to detect a predetermined optical signal received at said first photodetector element;
- a power supply circuit which starts the supply of power upon receiving said detection-use electric signal from said signal detecting circuit; and
- a signal output circuit supplied with power from said power supply circuit to amplify the electric signal from said second photodetector element and output an output-use electric signal.

According to another embodiment of the present invention, there is provided an electric apparatus having a photo-detecting semiconductor device to start operation upon receipt of a detection-use electric signal or an output-use electric signal from said photo-detecting semiconductor device, said photo-detecting semiconductor device comprising:

- a first photodetector element and a second photodetector element placed adjacent to each other and isolated from each other to each generate an electric signal responsive to a received optical signal;
- a signal detecting circuit which amplifies the electric signal from said first photodetector element and outputs said detection-use electric signal for detecting a predetermined optical signal received at said first photodetector element;
- a power supply circuit which starts the supply of power upon receiving said detection-use electric signal from said signal detecting circuit; and
- a signal output circuit supplied with power from said power supply circuit to amplify the electric signal from said second photodetector element and output said output-use electric signal.

BRIEF DESCRIPTION OF THE DRAWINGS

FIGS. 2A through 2F are perspective views of the photo-detecting semiconductor device of FIG. 1 in an enlarged scale;

DETAILED DESCRIPTION OF THE INVENTION

Some embodiments of the invention will now be explained below with reference to the drawings. These embodiments, however, should not be construed to limit the present invention.

Figure 1:
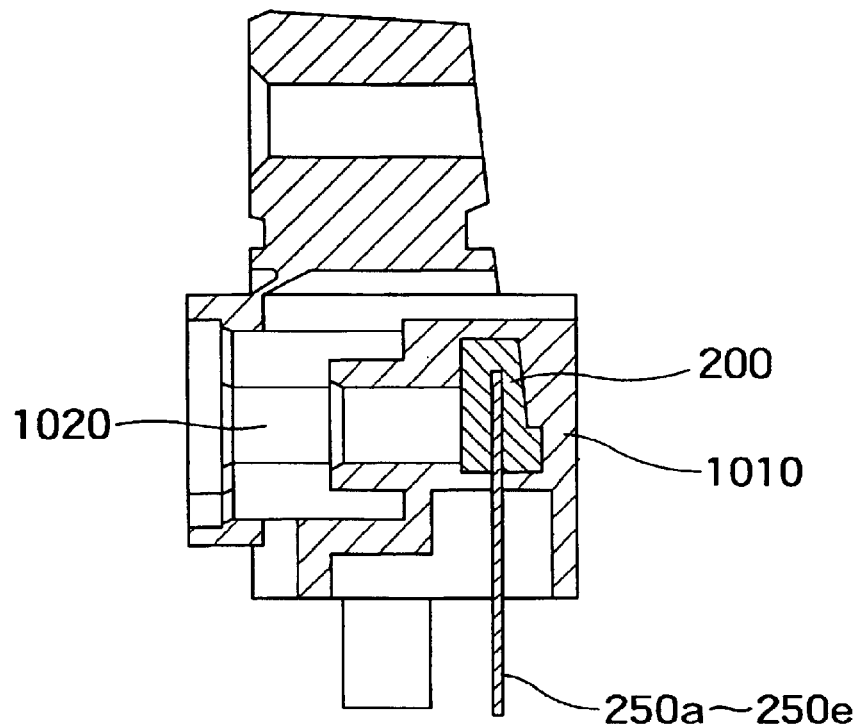
FIG. 1 is a cross-sectional view of a photo-detecting semiconductor device and its peripheral part of an electric apparatus according to an embodiment of the invention.

FIG. 1 is a cross-sectional view of a photo-detecting semiconductor device 200 and its peripheral part provided in an electronic apparatus according to an embodiment of the invention. The photo-detecting semiconductor device 200 including a photo-detecting semiconductor chip (not shown in FIG. 1) is fixed in a housing 1010. An optical transmission path (not shown), such as an optical fiber is inserted into an opening 1020. The optical transmission path transmits an optical signal to the front face of the photo-detecting semiconductor device 200 (see FIGS. 2A through 2F). The optical signal enters from the front face of the photo-detecting semiconductor device 200 and reaches the photo-detecting semiconductor element. An electric signal responsive to the optical signal is output as an output-use electric signal from the photo-detecting semiconductor element through at least one of leads 250a, 250b, 250c, 250d and 250e. The electric apparatus is, for example, a car-borne electric apparatus such as a car-borne audio apparatus, home-use electric appliance, a semiconductor manufacturing system or an apparatus related to FA (factory automation).

FIGS. 2A through 2F are schematic views of the photo-detecting semiconductor device 200 of FIG. 1 in an enlarged scale. They are a perspective view, a front view, a rear view, a right side view, a plan view and a bottom view, respectively. Its left side view is omitted here because it appears symmetrically of the right side view.

The photo-detecting semiconductor device 200 includes a photo-detective semiconductor chip 210 encapsulated in a resin 200, and leads 250a, 250b, 250c, 250d and 250e that are electrically connected to the photo-detective semiconductor chip 210. For simplicity, wires connecting the leads 250a through 250e to the photo-detective semiconductor chip 210 are omitted from illustration. The photo-detective semiconductor chip 210 is mounted on the grounding lead 250 to be connected to ground such that its back surface is connected to ground. The lead 250a, 250b, 250d or 250e is a power source lead in connection with the power source for supplying power, an output lead for outputting an output-use electric signal, or one of two detection leads for outputting a detection-use electric signal.

Referring to FIG. 2E, for the purpose of efficiently transmitting an optical signal from the transmission path to a photodetector element (not shown in FIGS. 2A through 2F) of the photo-detective semiconductor chip 210, a lens 230 is provided on the front face of the photo-detecting semiconductor device 200.

Figure 3:
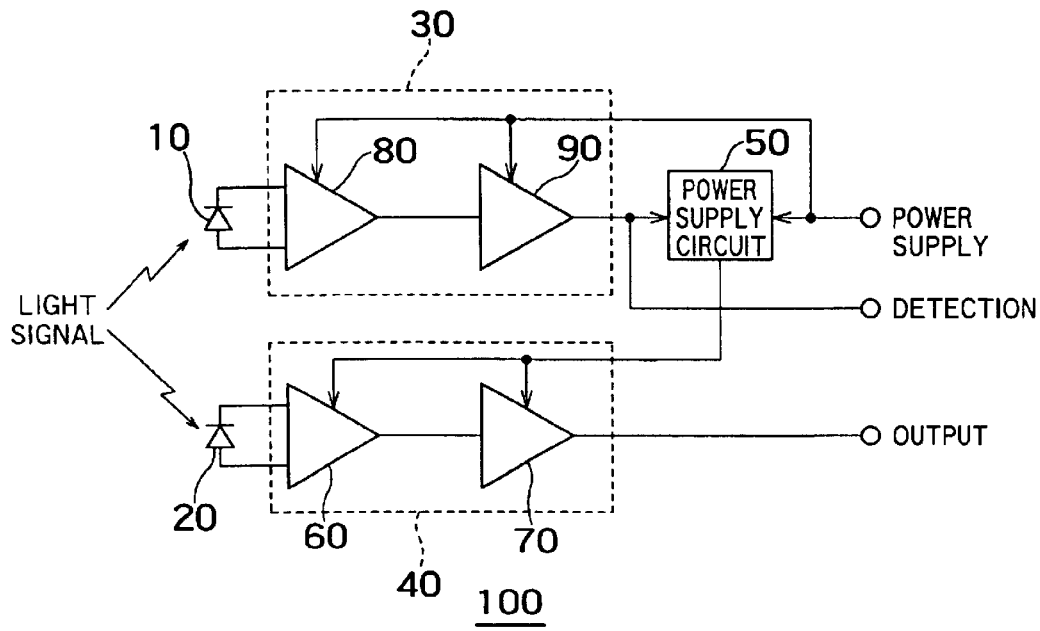
FIG. 3 is a block diagram of the internal circuit of a photo-detecting semiconductor device according to an embodiment of the invention.

FIG. 3 is a block diagram of the internal circuit 100 of a photo-detecting semiconductor device 200 according to an embodiment of the invention. The internal circuit 100 lies on the photo-detective semiconductor chip 210.

The internal circuit 100 photodetector elements 10, 20 that are located close to each other, isolated from each other and generate electric signals responsive to received optical signals; a signal detecting circuit 30 that amplifies the electric signal from the photodetector element 10 and supplies a detection-use electric signal for detecting a predetermined optical signal received at the photodetector element 10; a power supply circuit 50 responsive to the detection-use electric signal from the signal detecting circuit 30 to start the supply of power; and a signal output circuit 40 responsive to the supply of power from the power supply circuit 50 to amplify the electric signal from the photodetector element 20 and output it as an output-use electric signal.

The signal detecting circuit 30 includes an amplifier circuit 80 which amplifies the electric signal from the photodetector element 10; and a discriminator circuit 90 that determined whether the optical signal received at the photodetector element 10 is the predetermined optical signal or not, and if so, outputs the detection-use electric signal to the power supply circuit 50. The signal output circuit 40 includes an amplifier circuit 60 which amplifies the electric signal from the photodetector element 20, and a shaping/output circuit 70 which shapes the waveform of the amplified electric signal from the amplifier circuit 60 and outputs it as the output-use electrical signal.

The photodetector elements 10, 20 each have a PN or PIN junction and are supplied with a reverse bias voltage. Thus the photodetector elements 10, 20 can each generate a current derived from the detected light.

The amplifier circuits 80, 60 each use a bipolar transistor or a MOS transistor for amplifying the electric signal from the photodetector element 10 or 20.

The shaping/output circuit 70 and the discriminator circuit 90 each use a comparator which shapes or discriminates the electric signal from the amplifier circuit 60 or 80.

The power supply circuit 50 supplies a bipolar transistor or a MOS transistor for the switching purpose to receive a signal from the discriminating circuit 90 and supply power to the amplifier circuit 60 and the shaping/output circuit 70.

Amplifiers, in general, need more and more current from the power source as the speed of signals they treat becomes higher and higher because stray capacitance is produced in circuit elements and circuit wirings.

Figure 5:
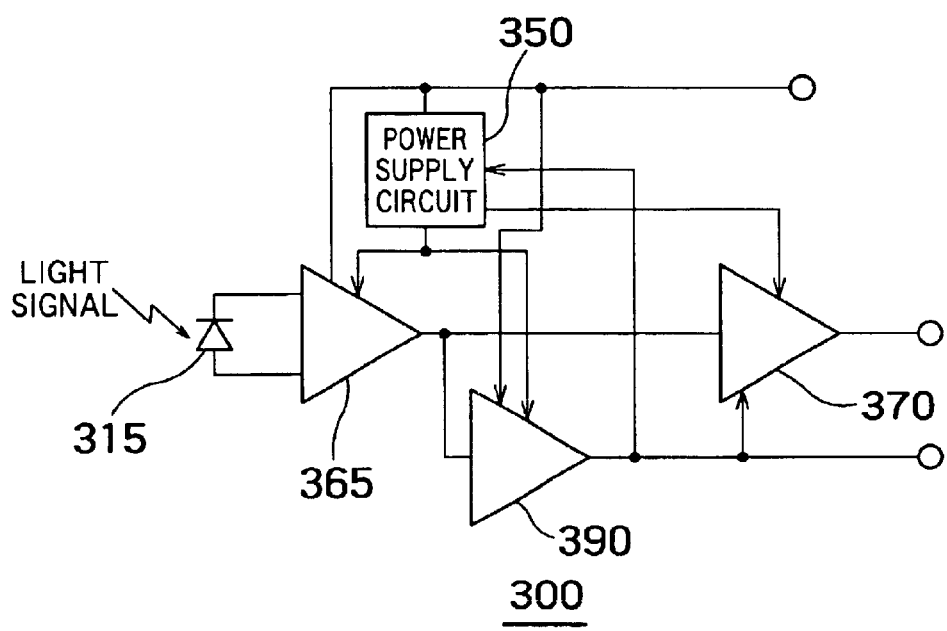
FIG. 5 is a block diagram of an internal circuit of a conventional photo-detecting semiconductor device.

Therefore, in the amplifier circuit 365 of FIG. 5 using a single amplifier, the amplifier must cope with not only a mode requiring a reduced power consumption for discriminating whether any signal is received or not (standby mode) but also a mode requiring high-speed response to output the electric signal as data and requiring the supply of sufficient power (operation mode). Therefore, to deal with different modes with the single amplifier, amplifier circuit 365 was inevitably complex in circuit arrangement, and nevertheless, it could not decrease the power consumption in the standby mode so much.

In contrast, the embodiment of the invention uses two amplifier circuits 80 and 60, and two photodetector elements 10, 20 isolated from each other are associated therewith, respectively. Since the photodetector element 10 and the amplifier circuit 80 are used to detect an optical signal, the amplifier circuit 80 need not have the speed as high as those of the other amplifier circuit 60 and the conventional amplifier circuit 365 used to output electric signals as data. That is, the amplifier circuit 80 consumes less power than the amplifier circuit 60 or 365. In addition, since the amplifier circuit 80 is independent from the amplifier circuit 60, the circuit arrangement of the amplifier circuit 80 and 60 is simpler as much as it can eliminate the changeover mechanism for changing the current to be consumed as compared with the conventional amplifier circuit 365.

The power source terminal, detection terminal or output terminal is connected to one of the leads 250a, 250b, 250d and 250e best shown in FIGS. 2A through 2C.

Operations of the internal circuit 100 shown in FIG. 3 will be next explained. When the photo-detecting semiconductor device 200 is in the operation mode, in which the internal circuit 100 operates, the photodetector elements 10, 20 receive an optical signal from the transmission path inserted in the opening 1020 best shown in FIG. 1.

The photodetector elements 10, 20 each convert the optical energy of the received optical signal into electric energy, and output electric signals to the signal detecting circuit 30 and signal output circuit 40, respectively.

The amplifier circuit 80 amplifies the electric signal from the photodetector element 10 and outputs it to the discriminator circuit 90.

The discriminator circuit 90 compares the voltage of the electric signal from the amplifier circuit 80 with the reference voltage. For example, only when the discriminator circuit 90 confirms an electric signal whose voltage is in the range of the reference voltage, it outputs that signal as the detection-use electric signal to the power supply circuit 50. Therefore, the internal circuit 10 is prevented from erroneous operation even when the photodetector element 10 detects light of an intensity having a voltage lower than the reference voltage and not ensured in transmission quality if it is transmitted as a transmission signal.

The power supply circuit 50 receives the detection-use electric signal from the discriminator circuit 90 and responsively supplies power from the power source terminal to the amplifier circuit 60 and the shaping/output circuit 70. Therefore, as long as the electric signal is detected by the photodetector element 10, the power supply circuit 50 continues the supply of power from the power source terminal to the amplifier circuit 60 and the shaping/output circuit 70.

The amplifier circuit 60 supplied with power from the power supply circuit 50 amplifies the electric signal from the photodetector element 20, and outputs it to the shaping/output circuit 70.

The shaping/output circuit 70 changes the waveform of the voltage of the electric signal from the amplifier circuit 60 into a rectangular wave having sharp rising and trailing edges, and outputs it to the output terminal.

When the photo-detecting semiconductor device 200 is in the standby mode where the internal circuit 100 remains at rest, no optical signal comes to the photodetector elements 10, 20. Since these photodetector elements 10, 20 do not supply any electric signal, the signal detecting circuit 30 outputs no detection-use electric signal to the power supply circuit 50, and the power supply circuit 50 supplies no power from the power source terminal to the amplifier circuit 60 and the shaping/output circuit 70. Accordingly, the amplifier circuit 60 and the shaping/output circuit 70 do not consume power.

Therefore, in the standby mode, although the discriminator circuit 90 and the amplifier circuit 80, which are relatively low in power consumption, certainly consume power, the amplifier circuit 60 and the shaping/output circuit 70, which are relatively high in power consumption, do not consume power. As a result, the internal circuit 100 in the present embodiment consumes much less power in the standby mode than the conventional internal circuit 300 shown in FIG. 5. Also in high-speed communication, the internal circuit 100 consumes relatively small power, and can prevent exhaustion of power sources such as batteries.

The amplifier circuit 80 or discriminator circuit 90 may include an integration circuit such that it can convert the pulsating waveform of the introduced transmission signal into a gentle waveform prior to comparison with the reference signal.

The current entirely consumed by a conventional photo-detecting semiconductor device was, for example, approximately 100 mW in the signal transmission mode (operation mode) and approximately 5 mW in the standby mode. In contrast, the current consumed by the photo-detecting semiconductor device according to the embodiment of the invention is approximately 100 mW in the signal transmission mode (operation mode) and approximately 1 mW or less in the standby mode. That is, the photo-detecting semiconductor device according to the instant embodiment can reduce the current it consumes in the standby mode to 1/5 of that of the conventional photo-detecting semiconductor device.

FIGS. 4A through 4D are diagrams illustrating some examples of cross-sectional arrangement of the photodetector elements 10 and 20. In any of these drawings, an insulating region (15a, 15b, 15c or 15d) insulates the photodetector element (10a, 10b, 10c or 10d) and the photodetector element (20a, 20b, 20c or 20d) from each other.

Figure 4A:
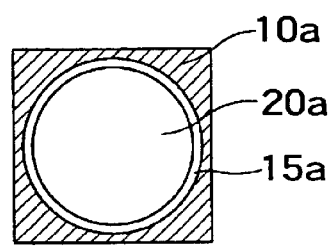
FIGS. 4A through 4D are diagrams illustrating some examples of cross-sectional arrangement of photodetector elements employable in embodiments of the invention.

In the configuration shown in FIG. 4A, the photodetector element 20a is circular, and the photodetector element 10a is disposed around the photodetector element 20a.

In general, light from an optical transmission path (typically an optical fiber) is most intensive at the center of the transmission path and gradually becomes weaker toward the circumference. Therefore, the photodetector element 10a used to detect an optical signal is disposed around the photodetector element 20a used to receive data and does not disturb data reception of the photodetector element 20a. As a result, the data content of the optical signal received by the photodetector element 20a is improved in accuracy and reliability.

Figure 4B:
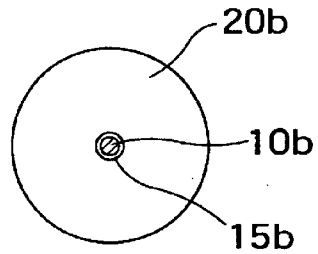

In the configuration shown in FIG. 4B, the photodetector element 10b is disposed in the center of the photodetector element 20b.

As mentioned above, light from a transmission path is most intensive at the center of the transmission path, so the signal detecting circuit 30 can reliably detect reception of an optical signal by the photodetector element 10b.

The area of the photodetector element 20b is preferably small such that it does not prevent the photodetector element 10b from receiving the optical.

Figure 4C:
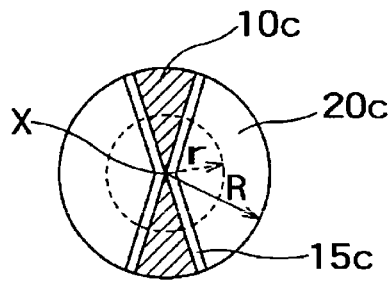

In the configuration shown in FIG. 4C, the ratio between the area of the photodetector element 10c and the area of the photodetector element 20c is constant throughout the entire radial extension. That is, since the photodetector element 10c and the photodetector element 20c form concentric sectors, the ratio between the area occupied by the photodetector element 10c and the area occupied by the photodetector element 20c is constant without changing with the distance from the common center X of these photodetector elements 10c, 20c.

Since light from the transmission path is most intensive at the center of the transmission path, it is possible to obtain an optical or electrical intensity of a signal proportional to the ratio between the area of the photodetector element 10c and the area of the photodetector element 20c. Therefore, by changing the ratio between the area of the photodetector element 10c and the area of the photodetector element 20c, it is possible to manufacture a photo-detecting semiconductor device with a desirable balance between the property of ensuring accuracy and reliability of the data contents of the optical signal and the property of ensuring detection of the optical signal. As the ratio in area of the photodetector element 10c relative to the photodetector element 20c becomes smaller, accuracy and reliability of the data contents of the optical signal is improved.

Figure 4D:
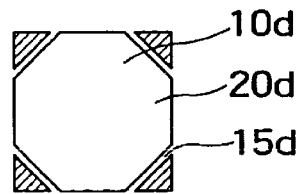

In the configuration shown in FIG. 4D, the photodetector element 20d is octagonal, and triangles as the photodetector element 10d are placed adjacent to four sides of the octagon of the photodetector element 20d such that both photodetector elements 10d and 20d form a square as a whole.

In the configurations shown in FIGS. 4a through 4c, the photodetector elements 20a, 20b, 20c are circular. Although the photodetector elements are preferred to be circular, circular photodetector elements are difficult to manufacture. Taking it into account, the configuration shown in FIG. 4D shapes the photodetector element 20d as a polygon near a circle to facilitate the manufacture of the photodetector elements. The polygon of the photodetector element 20d may be other than the octagon shown here, such as tetragon, pentagon, hexagon or other polygon. However, polygons nearer to circles are more preferable.

In the photo-detecting semiconductor device and electric apparatus according to any embodiment of the invention, the power consumption in the standby mode can be reduced than the power consumption in the standby mode of the conventional photo-detecting semiconductor device or electric apparatus while ensuring sufficient performance of true capability of circuit elements in the operation mode.

Additionally, in the photo-detecting semiconductor device and electric apparatus according to any embodiment of the invention, the amplifier circuit is simplified, and the photo-detecting semiconductor device and electric apparatus are reduced in size and improved in reliability.

What is claimed is:

1. A photo-detecting semiconductor device comprising:
   a first photodetector element and a second photodetector element placed adjacent to each other and isolated from each other to each generate an electric signal responsive to a received optical signal;
   a signal detecting circuit which amplifies the electric signal from said first photodetector element and outputs a detection-use electric signal to detect a predetermined optical signal received at said first photodetector element;
   a power supply circuit which starts the supply of power upon receiving said detection-use electric signal from said signal detecting circuit; and
   a signal output circuit supplied with power from said power supply circuit to amplify the electric signal from said second photodetector element and output an output-use electric signal.

2. A photo-detecting semiconductor device according to claim 1, wherein said signal detecting circuit includes a first amplifier circuit which amplifies the electric signal from said first photodetector element, and said signal output circuit includes a second amplifier circuit which amplifies the electric signal from said second photodetector element,
   power consumption of said first amplifier circuit being smaller than power consumption of said second amplifier circuit.

3. A photo-detecting semiconductor device according to claim 2, wherein said signal detecting circuit further includes a discriminator circuit which discriminates whether the optical signal received by said first photodetector element is a predetermined optical signal or not, and if it is the predetermined optical signal, outputs said detection-use electric signal to said power supply circuit, and
   said signal output circuit further includes a shaping/output circuit to shape the waveform of the amplified electric signal from said second amplifier circuit and to output said output-use electric signal.

4. A photo-detecting semiconductor device according to claim 1, wherein said first photodetector element is disposed around said second photodetector element.

5. A photo-detecting semiconductor device according to claim 4, wherein the area of said first photodetector element is smaller than the area of said second photodetector element.

6. A photo-detecting semiconductor device according to claim 1, wherein said first photodetector element is disposed at a central portion of said second photodetector element.

7. A photo-detecting semiconductor device according to claim 6, wherein the area of said first photodetector element is smaller than the area of said second photodetector element.

8. A photo-detecting semiconductor device according to claim 1, wherein the ratio in area between said first photodetector element and said second photodetector element is constant at any distance from a common center of said first photodetector element and said second photodetector element.

9. A photo-detecting semiconductor device according to claim 8, wherein the area of said first photodetector element is smaller than the area of said second photodetector element.

10. A photo-detecting semiconductor device according to claim 1, wherein said first photodetector element, said second photodetector element, said signal detecting circuit, said power supply circuit and said signal output circuit are integrally formed on a single semiconductor chip.

11. A photo-detecting semiconductor device according to claim 1, wherein said first photodetector element and said second photodetector element independently generate said electric signal responsive to the received optical signal.

12. An electric apparatus having a photo-detecting semiconductor device to start operation upon receipt of a detection-use electric signal or an output-use electric signal from said photo-detecting semiconductor device, said photo-detecting semiconductor device comprising:

a first photodetector element and a second photodetector element placed adjacent to each other and isolated from each other to each generate an electric signal responsive to a received optical signal;

a signal detecting circuit which amplifies the electric signal from said first photodetector element and outputs said detection-use electric signal for detecting a predetermined optical signal received at said first photodetector element;

a power supply circuit which starts the supply of power upon receiving said detection-use electric signal from said signal detecting circuit; and a signal output circuit supplied with power from said power supply circuit to amplifier the electric signal from said second photodetector element and output said output-use electric signal.

13. A photo-detecting semiconductor device according to claim 12 wherein said signal detecting circuit includes a first amplifier circuit which amplifies the electric signal from said first photodetector element, and a discriminator circuit which discriminates whether the optical signal received by said first photodetector element is a predetermined optical signal or not, and if it is the predetermined optical signal, outputs said detection-use electric signal to said power supply circuit;

said signal output circuit includes a second amplifier circuit which amplifies the electric signal from said second photodetector element, and a shaping/output circuit which shapes the waveform of the amplified electric signal from said second amplifier circuit and outputs said output-use electric signal; and power consumption of said first amplifier circuit is smaller than power consumption of said second amplifier circuit.

14. A photo-detecting semiconductor device according to claim 12, wherein said first photodetector element and said second photodetector element independently generate said electric signal responsive to the received optical signal.

* * * * *